US007932585B2

(12) United States Patent
Amigues et al.

(10) Patent No.: US 7,932,585 B2
(45) Date of Patent: Apr. 26, 2011

(54) ELECTRICAL COMPONENT AND FILM COMPOSITE LAMINATED ON THE COMPONENT AND METHOD FOR PRODUCTION

(75) Inventors: Laurence Amigues, München (DE); Michael Kaspar, Putzbrunn (DE); Herbert Schwarzbauer, München (DE)

(73) Assignee: Siemens Aktiengesellschaft, Munich (DE)

( * ) Notice: Subject to any disclaimer, the term of this patent is extended or adjusted under 35 U.S.C. 154(b) by 88 days.

(21) Appl. No.: 11/989,528

(22) PCT Filed: Jul. 10, 2006

(86) PCT No.: PCT/EP2006/064061
§ 371 (c)(1),
(2), (4) Date: Oct. 29, 2009

(87) PCT Pub. No.: WO2007/012558
PCT Pub. Date: Feb. 1, 2007

(65) Prior Publication Data
US 2010/0044889 A1    Feb. 25, 2010

(30) Foreign Application Priority Data

Jul. 26, 2005    (DE) .......................... 10 2005 034 873

(51) Int. Cl.
*H01L 23/58*    (2006.01)
(52) U.S. Cl. .......................... 257/642; 257/746; 438/652
(58) Field of Classification Search .................. 257/750, 257/758, 642, 746; 438/652, 623
See application file for complete search history.

(56) References Cited

U.S. PATENT DOCUMENTS

| 3,980,570 | A | * | 9/1976 | Okuda et al. | ............ 508/106 |
| 4,872,825 | A |   | 10/1989 | Ross |   |
| 5,041,319 | A |   | 8/1991 | Becker et al. |   |
| 5,406,124 | A | * | 4/1995 | Morita et al. | ............ 257/783 |
| 5,414,299 | A |   | 5/1995 | Wang et al. |   |
| 6,211,554 | B1 | * | 4/2001 | Whitney | ............ 257/355 |
| 6,965,071 | B2 | * | 11/2005 | Watchko et al. | ............ 174/377 |
| 7,733,011 | B2 | * | 6/2010 | Cina et al. | ............ 313/504 |
| 2003/0207492 | A1 | * | 11/2003 | Maeda et al. | ............ 438/107 |
| 2006/0197222 | A1 |   | 9/2006 | Auerbach et al. |   |
| 2007/0036944 | A1 |   | 2/2007 | Auerbach et al. |   |
| 2008/0317087 | A1 | * | 12/2008 | Kimura | ............ 374/1 |
| 2009/0251841 | A1 | * | 10/2009 | Whalin et al. | ............ 361/126 |
| 2010/0117483 | A1 | * | 5/2010 | Tanaka et al. | ............ 310/313 B |

FOREIGN PATENT DOCUMENTS

| DE | 103 35 155 A1 | 3/2005 |
| WO | 2005/027222 A2 | 3/2005 |

OTHER PUBLICATIONS

Office Action for German Application No. 10 2005 034.873.4-33; dated May 3, 2006.
International Search Report for Application No. PCT/EP2006/064061 mailed Jul. 12, 2006.

* cited by examiner

*Primary Examiner* — S. V Clark
(74) *Attorney, Agent, or Firm* — Staas & Halsey LLP

(57) ABSTRACT

At least one film composite is laminated on a surface of at least one electrical component. The film composite includes at least one electrically-conducting plastic film with at least one electrically conducting conductor. The electrically-conducting plastic film has a high-ohmic resistance. This method may be used in planar large-surface electrical contacting technology for the production of modules with power semiconductors, where an electrical contacting of the components is achieved by the plastic films. A low lateral electrical conductivity is achieved, such that an electrical charging of the plastic films required for the contacting technology is prevented on operation of the component or the module.

20 Claims, 1 Drawing Sheet

ELECTRICAL COMPONENT AND FILM COMPOSITE LAMINATED ON THE COMPONENT AND METHOD FOR PRODUCTION

CROSS REFERENCE TO RELATED APPLICATIONS

This application is based on and hereby claims priority to German Application No. 10 2005 034 873.4 filed on Jul. 26, 2005, the contents of which are hereby incorporated by reference.

BACKGROUND

Described below is a structure having at least one electrical component and at least one film composite laminated on a component surface of the component, the film composite having at least one electrically insulating insulation plastic film. A method for production of the structure is additionally specified.

An arrangement of this type is known for example from DE 103 35 155 A1. The component is a power semiconductor component applied on a substrate. The power semiconductor component has an electrical contact area averted from the substrate. A film composite including a plurality of electrically insulating insulation plastic films is laminated onto the power semiconductor component and onto the substrate. The individual insulation plastic films are laminated on under vacuum. This results in a particularly fixed and intimate contact between the power semiconductor component, the substrate and the film composite. As a result of the lamination, a surface contour given by a component surface of the power semiconductor component and a substrate surface of the substrate is reproduced by a surface contour of the film composite that is averted from the component surface and the substrate surface. The topography predefined by the component and the substrate is reproduced.

The power semiconductor component is soldered onto the substrate in such a way that an electrical contact area of the component is averted from the substrate. The electrical contact area of the power semiconductor component is electrically contact-connected with the aid of an electrical connecting line. The electrical connecting line is formed by a large-area electrical connecting track which is applied on the film composite and lead through a window in the film composite.

When an operating voltage of hundreds to a few thousands of volts is applied to the connecting track, a high lateral electric field can occur at an edge or corner of the connecting track lying on the film composite. In air the high electric field can lead to a creeping discharge on the film composite. Damage to the film composite can occur on account of the creeping discharge.

SUMMARY

An aspect is to show how a probability of the occurrence of creeping discharges can be reduced in the case of the arrangement described above.

Described below is an arrangement of at least one electrical component and at least one film composite laminated on a component surface of the component, the film composite having at least one electrically insulating insulation plastic film. The arrangement is wherein the film composite has at least one electrically conducting conductor plastic film with at least one electrically conductive conductor material. The electrically conducting conductor plastic film preferably forms a film surface of the film composite.

Also described below is a method for production of the arrangement, including the following: a) providing the electrical component having a component surface, and b) producing the laminated film composite on the component surface.

The basic concept is to provide a film composite which has an electrically insulating effect perpendicular to the film composite by the insulation plastic film and furthermore has a certain electrical conductivity along the film surface by the conductor plastic film. Lateral electric field strengths at conductor track edges are significantly reduced on account of the electrical conductivity of the conductor plastic film. The conductor plastic film prevents the build-up of electric fields. Electrical charge occurring on the film composite surface of the film composite can flow away.

In one particular configuration, the film composite has at least one further insulating insulation plastic film and/or at least one further electrically conducting conductor plastic film with a further electrically conductive conductor material. The film composite has a plurality of electrically conducting and/or a plurality of electrically insulating plastic films. In this case, one or a plurality of insulation plastic films and/or one or a plurality of insulating insulation plastic films may be present. In this case, the conductor plastic films are arranged in the film composite in such a way that high electric fields which could lead to creeping discharges on the insulation layer in air do not occur during operation of the electrical component. This means that the conductor plastic films preferably form outer layers of a sandwich structure. The inner layers of the sandwich structure are formed by the insulation plastic films. The insulation plastic films are arranged between the conductor plastic films.

The electrically conducting conductor plastic films have a low electrical conductivity. They should be referred to as high-resistance conductor films. In one particular configuration, the conductor plastic film and/or the further conductor plastic film have/has an electrical surface resistance selected from the range of $1 \cdot 10^8$ Ω to $1 \cdot 10^{13}$ Ω inclusive, and in particular an electrical surface resistance selected from the range of $1 \cdot 10^{10}$ Ω to $1 \cdot 10^{13}$ Ω inclusive. The surface resistance is so low that electrical charge that occurs can flow away. This concerns, in particular, corners and edges of the electrical component onto which the film composite is laminated. However, this also concerns, in particular, corners and edges of an electrical connecting line for making electrical contact with the component. Precisely here, too, particularly high electric fields can occur during operation.

The electrically conductive conductor material and/or the further electrically conductive conductor material can be any desired organic or inorganic conductor materials. In one particular configuration, the conductor material and/or the further conductor material have/has elemental carbon. The carbon is present for example as carbon black or as graphite in a particle composite (see below). In addition, the conductor material and/or the further conductor material can also be a conductor polymer (electrically conducting polymer). Metallic and ceramic conductor materials are also conceivable.

In accordance with one particular configuration, the conductor plastic film has a particle composite with a base plastic and the conductor material and/or the further plastic film has a further particle composite with a further base plastic and the further conductor material as filler. Composite materials are an essential constituent of the conductor plastic films. The particle composite and/or the further particle composite has/have at least two phases. One of the phases is formed by the respective base plastic. The respective conductor material is contained as powder and if possible distributed homogeneously in the respective base plastic. In this case, an average particle diameter of the powder depends, inter alia, on the film thickness of the respective conductor plastic film. By way of example, the average particle diameter given a film thickness of approximately 20 μm is preferably less than 1 μm. Particularly carbon black or graphite are suitable as electrically conductive fillers. These materials have the effect that the conductor plastic film becomes black. The probability of damage to the conductor plastic film caused by light, in particular by UV light, is significantly reduced. What is more, the black plastic film improves the use of laser ablation for opening windows in the film composite for the purpose of making electrical contact (see below). Likewise, laser ablation residues can be more easily identified and removed.

In principle, it is possible to use different base materials for each of the plastic films. With regard to a particularly fixed and intimate contact within the film composite, it is particularly advantageous to use the same base plastic for all or for a plurality of the plastic films. This reduces the probability of the occurrence of a delamination process between the plastic films of the film composite. In accordance with one particular configuration, therefore, the insulation plastic film has the base plastic of the particle composite of the conductor plastic film and/or the further base plastic of the further conductor plastic film. In particular, the base plastic and the further base plastic are also identical. Any desired thermoplastics, thermosetting plastics and mixtures thereof are conceivable as base plastics. Such base plastics are for example polyimide (PI), polyethylene (PE), polyphenol and epoxides.

The previous explanations essentially relate to direct-current applications. With regard to high-frequency applications which can include both direct and alternating currents, it is particularly advantageous to concomitantly process material having a high dielectric constant in the conductor plastic films. The material having a high dielectric constant, which is likewise used as a filler in the conductor plastic films, serves for regulating the high-frequency alternating electric fields that can occur in high-frequency applications. In one particular configuration, therefore, the conductor plastic film and/or the further conductor plastic film have/has at least one dielectric filler having a relative permittivity of more than 10, and in particular of more than 50. The dielectric filler is based for example on the barium-strontium-titanate system. This ceramic contains barium and strontium in different proportions with respect to one another. Pure barium titanate or pure strontium titanate are also conceivable.

The film thicknesses of the plastic films of the film composite depend on different standpoints. Thus, the laminatability or the processability of the plastic films plays an important part. Furthermore, it is important to choose the film thicknesses of the plastic films in such a way that the required electrical or dielectric properties of the individual plastic films are obtained. Thus, by way of example, the breakdown strength of the film composite is controlled by way of the film thickness of the insulation plastic films. Depending on the base plastic, the film thicknesses can be 10 μm to 150 μm. The film thickness of the insulation plastic film is preferably selected from the range of 20 μm to 100 μm.

In the case of the conductor plastic films it is important to provide for a required electrical surface conductivity through the selection of the film thickness. In one particular configuration, the conductor plastic film and the further conductor plastic film have a film thickness selected from the range of 1 μm to 50 μm inclusive, and in particular from the range of 5 μm to 20 μm inclusive. By way of example, the electrical resistivity of the conductor plastic film is less than $10^{10}$ Ω·cm.

Given a film thickness (layer thickness) of 10 μm, a surface resistance of less than $1·10^{13}$ Ω would result. This surface resistance suffices for example to prevent electrical charging of the film composite surface by a leakage current that occurs at DC voltage of hundreds of V. For alternating current, a lower surface resistance may also be necessary in order additionally to dissipate capacitive charge-reversal currents.

In accordance with one particular configuration, the component and the plastic film or the component and one of the conductor plastic films are in direct contact with one another. Electrical charge that occurs in a desired or undesired manner on the component can be conducted away efficiently in this way. A multilayer construction of the film composite including at least two conductor plastic films and an insulation plastic film arranged between the plastic films may be used.

In accordance with one particular configuration, the following are carried out for producing the laminated film composite: c) providing a prefabricated film composite, and d) laminating the prefabricated film composite onto the component surface of the component. The film composite is produced prior to lamination. The lamination is preferably effected under vacuum. A particularly fixed and intimate contact between the component surface and the film composite is produced as a result.

In accordance with a further variant of the production method, individual plastic films of the film composite are laminated on for producing the laminated film composite. In this case, the individual plastic films can be laminated on in a single lamination step. For this purpose, the plastic films are placed onto the component one above another. Lamination is subsequently effected, the film composite arising. It is also conceivable for the plastic films to be successively laminated on in separate lamination steps and to be processed to form the film composite.

The arrangement can have any desired electrical component, for example an electrical connecting line or a capacitor. In one particular configuration, the component is a semiconductor component and in particular a power semiconductor component. The power semiconductor component is selected from the group IGBT, diode, MOSFET, thyristor and bipolar transistor. Precisely these power semiconductor components are operated at voltages of a few hundred V to kV. With the aid of the film composite, the occurrence of field spikes is efficiently suppressed particularly at corners and edges.

In one particular configuration, the component is arranged on a substrate and the film composite is laminated on the component surface of the component and on a substrate surface of the substrate in such a way that a surface contour formed by the component surface of the component and by the substrate surface of the substrate is reproduced in a surface contour of the film composite which is averted from the component surface and the substrate surface. The surface contour (topography) of the component and of the substrate is impressed on the film composite. The film composite follows the surface contour of the component and of the substrate. This concerns in particular corners and edges of the component and of the substrate. An impression of the surface contour of the component and of the substrate is achieved by virtue of the fact that the film composite is laminated onto the component and onto the substrate (see above).

In one particular configuration, an electrical plated-through hole through the film composite is present for contact-connecting the electrical contact area of the component. By way of example, the component is applied on a substrate. The plated-through hole can be part of an electrical connecting line for electrically contact-connecting the contact area of the component which is averted from the substrate. In order to produce an arrangement of this type, by way of example, after the lamination of the film composite, at least one window is opened in the film uncovered as a result of the window being opened. The window is opened for example by laser ablation or by a photolithography process. Electrically conductive conductor material is subsequently deposited.

In the case of an electrical component in the form of a semiconductor component or power semiconductor component, it has proved worthwhile to deposit different conductor materials to form a multilayer connecting line. The connecting line includes metallization layers arranged one above another. By way of example, the contact area of the power semiconductor component is composed of aluminum. A bottommost metallization layer applied directly to the contact area of the power semiconductor component is composed of titanium, for example, and functions as an adhesion promoting layer. A metallization layer arranged above that is composed of a titanium-tungsten alloy, which functions as a barrier layer for copper ions. In addition, a copper layer is also applied. The metallization layers mentioned are produced with the aid of vapor deposition methods, in particular with the aid of PVD (physical vapor deposition) or CVD (chemical vapor deposition), with layer thicknesses of less than 50 nm. The last copper layer functions as a so-called seed layer for an electrolytic copper layer to be deposited. The copper layer, the layer thickness of which may be up to a few hundred μm, provides for a required current-carrying capacity, in particular with regard to the driving of power semiconductor components.

To summarize, the following essential advantages are afforded:

- The film composite is electrically insulated on account of the electrical insulation plastic film in the thickness direction. The electrical conductor plastic film provides for a lateral electrical conductivity of the film composite. Consequently, electrical charges that occur at the film composite can be dissipated laterally.
- In particular by virtue of the arrangement of the conductor plastic film at a surface of the film composite, it is possible to reduce the lateral field strength at conductor track edges to an extent such that the insulation strength for air is not exceeded. As a consequence of this, creeping discharges do not occur.
- In the case of the large-area contact connection of electrical components with the aid of the lamination technique for the production of modules, it is possible to dispense with a potting of the module for additional electrical insulation.
- If the electrically conductive conductor plastic film is directly in contact with the component, for example a power semiconductor component, the magnitude of the electric fields that occur is reduced at edges of the component. Moreover, the problem of partial discharges that can occur for example at an interface between a ceramic substrate and the component is reduced. Partial discharges can be the cause of the detachment of the laminated film composite.
- For production it is possible to have recourse to previously known lamination techniques.
- The conductor plastic film prevents electrical charging of the film composite during processing.

BRIEF DESCRIPTION OF THE DRAWINGS

These and other aspects and advantages will become more apparent and more readily appreciated from the following description of exemplary embodiments, taken in conjunction with the accompanying drawings which are schematic and do not represent illustrations that are true to scale and of which.

DETAILED DESCRIPTION OF THE PREFERRED EMBODIMENT

Figure 1:
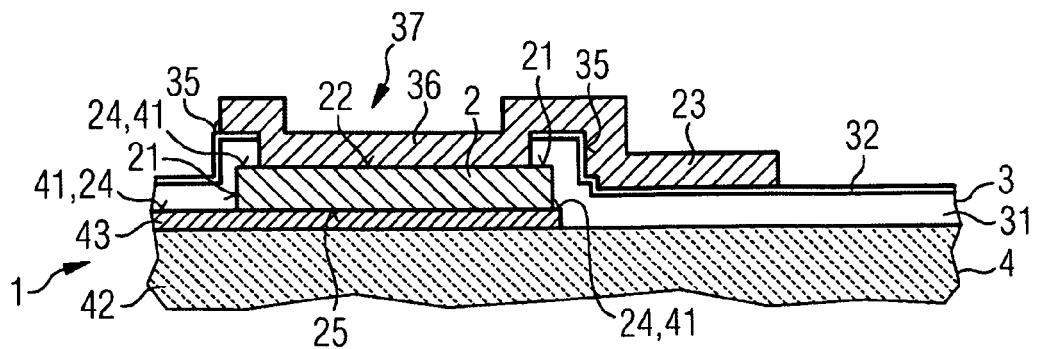
FIGS. 1 and 2 are each a partial lateral cross section of a structure described below.

Reference will now be made in detail to the preferred embodiments, examples of which are illustrated in the accompanying drawings, wherein like reference numerals refer to like elements throughout.

The exemplary embodiments relate in each case to an arrangement 1 of at least one electrical component 2 and at least one film composite 3 laminated on a component surface 21 of the component 2.

The electrical component 2 is a power semiconductor component in the form of a MOSFET. In an alternative embodiment to this, the power semiconductor component 2 is an IGBT.

The film composite 3 has a multilayer construction including at least one electrically insulating insulation plastic film 31 and at least one electrically conducting conductor plastic film 32.

The conductor plastic film 32 is composed of electrically high-resistance conducting material. This high-resistance conducting material is a particle composite including an electrically insulating base plastic and pulverulent electrically conductive conductor material as filler. The conductor material is pulverulent elemental carbon. An average particle diameter of the pulverulent carbon is less than 1 μm. In an alternative exemplary embodiment to this, the conductor material is a pulverulent metal having corresponding particle diameters. A filler content of the elemental carbon or of the metal in the respective particle composite and a film thickness 321 of the electrically conducting conductor plastic film are in each case chosen in such a way as to result in an electrical surface resistance of the conductor plastic film of approximately $1 \cdot 10^{11}$ Ω. The film thickness 321 of the conductor plastic film is approximately 10 μm.

Further exemplary embodiments arise from the fact that the particle composite of the conductor plastic film additionally has a pulverulent dielectric filler having a relative permittivity of more than 50. The dielectric filler is a barium-strontium-titanate. The average particle diameter of the barium-strontium-titanate powder is likewise less than 1 μm. This embodiment is particularly advantageous for high-frequency applications in the MHz to GHz range.

The insulation plastic film 31 is composed of the base plastic of the conductor plastic film 32. In an alternative embodiment to this, the insulation plastic film 31 is composed of a different plastic than the base plastic of the conductor plastic film 32.

The film composite 3 is laminated on the component surface 21 of the power semiconductor component 2 in such a way that the insulation plastic film 31 is directly in contact with the component surface 21 (FIG. 1). In an alternative embodiment (not illustrated) to this, the conductor plastic film 32 rather than the insulation plastic film 31 is directly in contact with the component surface 21.

Figure 2:
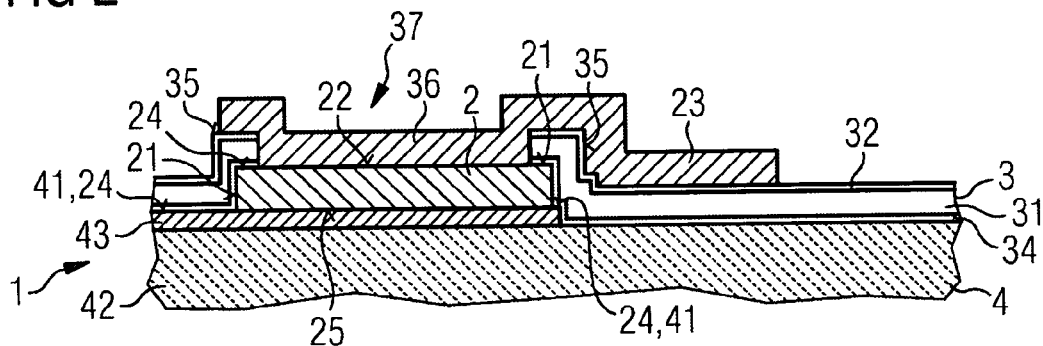

Further exemplary embodiments arise from the fact that at least one further insulation plastic film 33 and/or at least one further conductor plastic film 34 are/is used. In accordance with FIG. 2, the film composite 3 includes a conductor plastic film 32, a further conductor plastic film 34 and an insulation plastic film 31 arranged between the conductor plastic films 32 and 34. The further conductor plastic film 34 is identical to the conductor plastic film 32. This means that the further particle composite of the further conductor plastic film 34 is the same particle composite as the conductor plastic film 32. Furthermore, the film thickness 321 of the conductor plastic film and the film thickness 341 of the further conductor plastic film are identical. This results in identical electrical surface resistances for the two conductor plastic films 32 and 34. This symmetrical sandwich structure affords the further advantage that during production, no confusion of the sides can occur during the lamination of the film composite. The film composite 3 is laminated onto the power semiconductor component 2 in such a way that the further conductor plastic film 34 is directly in contact with the component surface 21 of the power semiconductor component 2.

Figure 3:
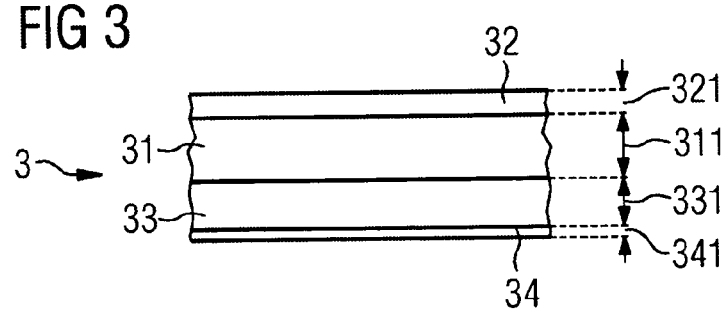
FIG. 3 is a lateral cross section of a film composite of the structure.

Further exemplary embodiments arise through the use of further conductor plastic films 34 and further insulation plastic films 33. The arrangement 1 has a film composite 3 laminated onto the component surface 21 and having a multiplicity of different plastic films 31, 32, 33 and 34. FIG. 3 illustrates a film composite 3 having, alongside the insulation plastic film 31, a further insulation plastic film 33 arranged between the conductor plastic films 32 and 34. The film thicknesses 311 and 331 of the insulation plastic films 31, 33 are in each case approximately 50 μm. In alternative exemplary embodiments to this, the insulation plastic films 31, 32 have different film thicknesses 311 and 331. The same applies to the film thicknesses 321 and 341 of the conductor plastic films 32 and 34. In accordance with a first embodiment, all the plastic films 31, 32, 33 and 34 have the same plastic. In an alternative embodiment to this, the plastic films 31, 32, 33 and 34 have different plastics.

The power semiconductor component 2 is applied on a substrate 4 in such a way that an electrical contact area 22 of the power semiconductor component 2 is averted from the substrate (FIG. 1). The substrate 4 is a DCB (direct copper bonding) substrate. In the case of the DCB substrate 4, a ceramic layer 42 is provided with copper layers 43 on both sides. The power semiconductor component 2 is soldered onto the copper layer 43. The copper layer 43 serves for making electrical contact with a further electrical contact area 25—facing the substrate 4—of the power semiconductor component 2.

The power semiconductor component 2 is part of an overall module (not illustrated) in which a plurality of power semiconductor components 2 are arranged and wired on a single, common substrate 4.

The electrical contact area 22—facing away from the substrate 4—of the power semiconductor component 2 is electrically contact-connected over a large area. For this purpose, the film composite 3 is laminated onto the component surface 21 of the power semiconductor component 2 and the substrate surface 41 of the substrate 4 in such a way that a surface contour 24 formed by the component surface 21 of the power semiconductor component 2 and by the substrate surface 41 of the substrate 4 is reproduced in the surface contour 35 of the film composite 3 which is averted from the component surface 21 of the power semiconductor component 2 and the substrate surface 41 of the substrate 4. A prefabricated film composite 3 is laminated on. In an alternative embodiment to this, the insulation plastic film 31 and the conductor plastic film 32 are laminated on individually, such that the film composite 3 arises during lamination. No prefabricated film composite 3 is laminated on.

After lamination, material of the film composite 3 is removed in the film composite 3 in order to uncover the contact area 22 of the power semiconductor component 2. This is done by laser ablation. In an alternative embodiment to this, a photolithography method is used for removing the material. The removal of the material gives rise to a window 37 in the film composite 3. The contact area 22 of the power semiconductor component 2 is freely accessible. In an alternative embodiment to the methods described, a freely accessible contact area 22 is obtained by laminating on a prefabricated film composite 3 which already has the window 37 for the free accessibility of the contact area 22.

After the contact area 22 has been uncovered, an electrical connecting line 23 for making electrical contact with the contact area 22 is applied on the contact area 22 and on the film composite 3. The electrical plated-through hole 36 through the film composite 3 is formed in the process. For this purpose, electrically conducting materials are applied in multilayer fashion on the contact area 22 and on a film surface of the film composite 3 which is averted from the substrate 4 and the power semiconductor component 2. The application is effected by PVD, giving rise to a titanium layer as an adhesion promoting layer, a titanium-tungsten layer as a barrier layer for copper, and a copper layer having a layer thickness of in each case less than 50 nm. The copper layer deposited by PVD functions as a seed layer for copper that is subsequently deposited electrolytically with a layer thickness of approximately 200 μm. This electrolytically deposited copper layer provides for a current-carrying capacity required for the operation of the power semiconductor component 2.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A structure comprising:
   at least one electrical component having a component surface; and
   at least one film composite laminated on the component surface of said at least one electrical component, said at least one film composite including
      at least one electrically insulating plastic film, and
      at least one electrically conducting plastic film formed of an electrically conductive material and having a first electrical surface resistance selected from the range of $10^8$ ohms to $10^{13}$ ohms inclusive.

2. The structure as claimed in claim 1, wherein the first electrical surface resistance is selected from the range of $10^{10}$ ohms to $10^{13}$ ohms inclusive.

3. The structure as claimed in claim 2, wherein the electrically conducting plastic film forms a film composite surface of said at least one film composite.

4. The structure as claimed in claim 3, wherein said at least one film composite has at least one additional electrically insulating plastic film and/or at least one additional electrically conducting plastic film formed of another electrically conductive material.

5. The structure as claimed in claim 4, wherein the at least one additional electrically conducting plastic film has a second electrical surface resistance selected from the range of $10^8$ ohms to $10^{13}$ ohms inclusive.

6. The structure as claimed in claim 5, wherein the second electrical surface resistance is selected from the range of $10^{10}$ ohms to $10^{13}$ ohms inclusive.

7. The structure as claimed in claim 6, wherein at least one of the conductive material and the other conductive material includes elemental carbon.

8. The structure as claimed in claim 7, wherein the at least one electrically conducting plastic film has a particle composite with a base plastic and the conductive material and/or the at least one additional electrically conducting plastic film has a further particle composite with a further base plastic and the other conductive material as further filler.

9. The structure as claimed in claim 8, wherein the at least one electrically insulating plastic film and/or the at least one additional electrically insulating plastic film have/has the base plastic of the particle composite of the at least one electrically conducting plastic film and/or the further base plastic of the further particle composite of the at least one additional electrically conducting plastic film.

10. The structure as claimed in claim 9, wherein the at least one electrically conducting plastic film and/or the at least one additional electrically conducting plastic film have/has at least one dielectric filler having a relative permittivity of more than 10.

11. The structure as claimed in claim 10, wherein the relative permittivity of the at least one dielectric filler is more than 50.

12. The structure as claimed in claim 11, wherein the at least one electrically conducting plastic film and/or the at least one additional electrically conducting plastic film have/has a film thickness selected from the range of 1 µm to 50 µm inclusive.

13. The structure as claimed in claim 12, wherein the film thickness selected from the range of 5 µm to 20 µm inclusive.

14. The structure as claimed in claim 13,
further comprising a substrate, having a substrate surface, on which said at least one electrical component is arranged, and
wherein said at least one film composite is laminated on the component surface of said at least one electrical component and on the substrate surface of said substrate such that a surface contour formed by the component surface of said at least one electrical component and by the substrate surface of the substrate is reproduced in a surface contour of said at least one film composite which is averted from the component surface and the substrate surface.

15. The structure as claimed in claim 14, wherein said at least one electrical component has an electrical contact area which is contact-connected via an electrical plated-through hole through said at least one film composite.

16. The structure as claimed in claim 15, wherein said at least one electrical component is a semiconductor component.

17. The structure as claimed in claim 16, wherein the semiconductor component is a power semiconductor component selected from the group IGBT, diode, MOSFET, thyristor and bipolar transistor.

18. A method for production of a structure, comprising:
providing at least one electrical component having a component surface, and
producing a laminated film composite on the component surface, including at least one electrically insulating plastic film and at least one electrically conducting plastic film formed of an electrically conductive material and having an electrical surface resistance selected from the range of $10^8$ ohms to $10^{13}$ ohms inclusive.

19. The method as claimed in claim 18, wherein said producing the laminated film composite comprises:
providing a prefabricated film composite; and
laminating the prefabricated film composite onto the component surface of the at least one component.

20. The method as claimed in claim 18, wherein said producing the laminated film composite comprises laminating individual plastic films of the film composite onto the component surface of the at least one component.

* * * * *